(12) United States Patent
Valentine

(10) Patent No.: US 6,674,653 B1
(45) Date of Patent: Jan. 6, 2004

(54) SHIELDING SCHEME FOR A CIRCUIT BOARD

(75) Inventor: Roger Valentine, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/293,328

(22) Filed: Apr. 16, 1999

(51) Int. Cl.[7] .................................................. H05K 9/00
(52) U.S. Cl. ....................... 361/818; 361/816; 361/800; 174/35 R; 174/35 GC
(58) Field of Search ................................. 361/814, 816, 361/818, 799, 800, 753, 752; 174/35 R, 35 TS, 35 GC, 35 MS

(56) References Cited

U.S. PATENT DOCUMENTS 5,550,713 A * 8/1996 Pressler ....................... 361/818

* cited by examiner

Primary Examiner—Phuong T. Vu
(74) Attorney, Agent, or Firm—John L. Imperato

(57) ABSTRACT

In a shielding scheme for circuit boards, conductive shields have contoured mating surfaces that become flat, or co-planar, at the circuit board-shield interface when the shields are fastened to opposite sides of the circuit board. The contoured mating surfaces compensate for deformation of the shields resulting from the fastening so that uniform mechanical pressure is applied at all designated points along the circuit board-shield interface even though fastening points are intermittently spaced throughout the shields. When compressible conductive gaskets are optionally interposed between the shields and the circuit board, stops are included to accommodate for the thickness of the gasket. High signal isolation is achieved without correspondingly high contact area on the circuit board and without closely-spaced fastening points. Low assembly time and manufacturing cost results for shielded circuit board assemblies incorporating the shielding scheme.

20 Claims, 3 Drawing Sheets

SHIELDING SCHEME FOR A CIRCUIT BOARD

BACKGROUND OF THE INVENTION

Conductive shields provide signal isolation in electrical circuits and systems. Typically, conductive shields are positioned on opposite sides of a printed circuit (PC) board and screwed together, sandwiching the PC board between the shields. Compressible conductive gaskets placed between the PC board and each of the shields lowers electrical resistance at each of the board-shield interfaces. Lower electrical resistance generally produces higher signal isolation. Since performance specifications in many circuits and systems are only attainable if signal isolation is sufficiently high, providing a low electrical resistance at the board-shield interfaces is critical.

The electrical resistance at each board-shield interface decreases as pressure on the gasket increases, causing signal isolation to be limited by the point along the interface at which the mechanical pressure on the gasket is lowest. Therefore, sufficiently high mechanical pressure must be applied to the compressible conductive gasket uniformly, at all points along the board-shield interface, to achieve sufficiently high signal isolation. Providing uniform mechanical pressure to the compressible conductive gaskets is a difficult task. Typically, attachment screws are used to fasten the conductive shields to the PC board, and when the screws are tightened, the shields deform. This deformation results in uneven pressure on the gasket. The pressure on the gasket in the vicinity of the attachment screw is higher than the pressure on the gasket at other points along the interface.

In presently used shielding schemes, uniform mechanical pressure is provided to the gasket by minimizing deformation of the conductive shields. Deformation is minimized by making the shields rigid and by positioning the attachment screws at closely-spaced intervals. However, making the shields rigid results in the walls of the shields being thick which causes a large contact area between the compressible gasket and the PC board. This large contact area occupies PC board area that would otherwise be useable for mounting electrical components. In addition, closely spacing the attachment screws increases the total number of attachment screws in the shielded PC board assembly, causing the assembly time and manufacturing costs of shielded PC board assemblies to correspondingly increase. Accordingly, there is a need for a PC board shielding scheme that achieves sufficiently high signal isolation while minimizing contact area and minimizing the number of attachment screws.

SUMMARY OF THE INVENTION

In a shielding scheme for circuit boards constructed according to the preferred embodiment of the present invention, conductive shields have contoured mating surfaces that become flat, or co-planar, at the circuit board-shield interface when the shields are fastened to opposite sides of the circuit board. The contoured mating surfaces compensate for deformation of the shields resulting from the fastening so that uniform mechanical pressure is applied at all designated points along the circuit board-shield interface even though fastening points are intermittently spaced throughout the shields. When compressible conductive gaskets are optionally interposed between the shields and the circuit board, stops are included to accommodate for the thickness of the gasket. High signal isolation is achieved without correspondingly high contact area on the circuit board and without closely-spaced fastening points. Low assembly time and manufacturing cost results for shielded circuit board assemblies incorporating the shielding scheme.

DETAILED DESCRIPTION OF THE PREFERRED EMBODIMENT

Figure 1A:
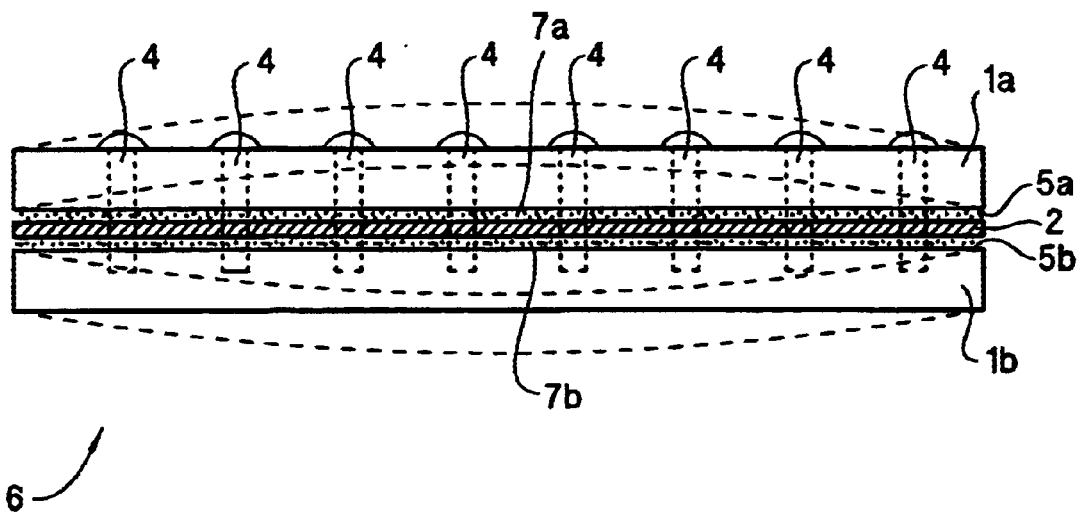
FIGS. 1A and 1B show a prior art shielding scheme.
Figure 1B:
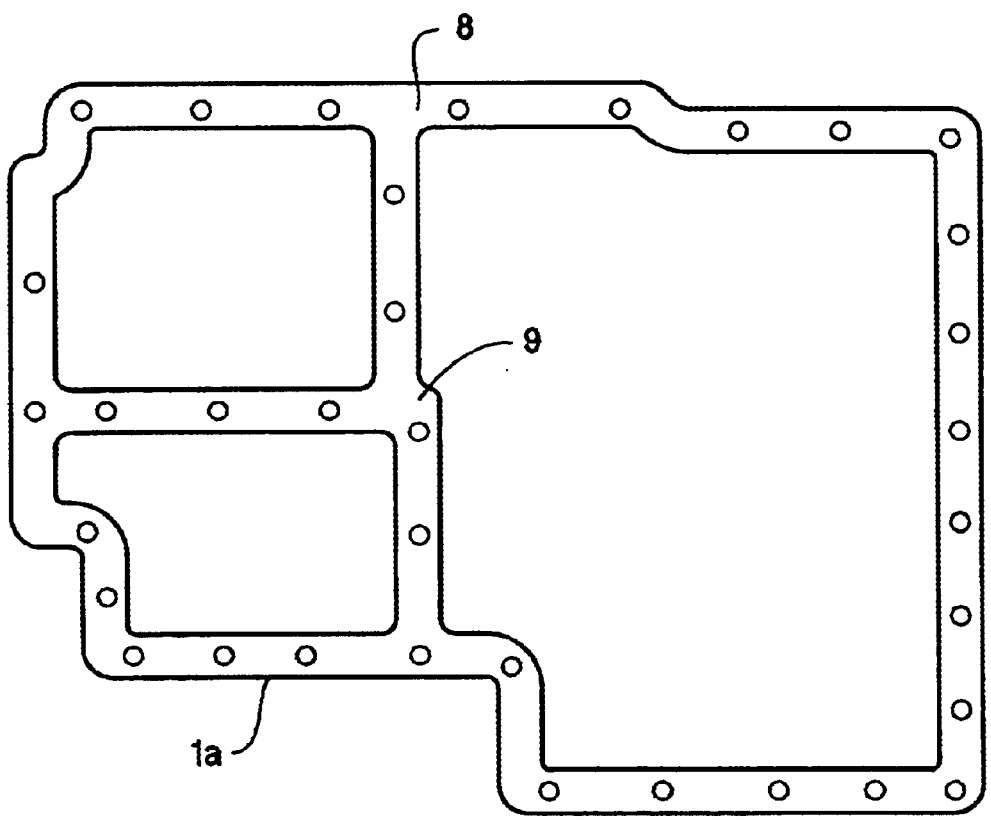

FIGS. 1A and 1B show a prior art shielding scheme. A conductive shield 1a, 1b is fastened to each side of a circuit board 2, such as an epoxy-glass printed circuit (PC) board. Typically, the surface of at least one side of the PC board 2 has exposed electrical components and conductive traces (not shown). The conductive shields 1a, 1b provide signal isolation between electrical components and traces within different sections of the board, and signal isolation between circuits or systems external to the PC board 2.

In the side view shown in FIG. 1A the conductive shields 1a, 1b are fastened together with the circuit board 2 sandwiched between the shields to form a shield circuit board assembly 6. Typically, one of the conductive shields 1a, 1b has threaded holes for receiving screws 4 that fasten the shields 1a, 1b on either side the board 2. Screws 4 are closely-spaced to ensure that intimate electrical contact is made at all points along the board-shield interfaces 5a, 5b. To lower electrical resistance at the board-shield interfaces 5a, 5b, compressible conductive gaskets 7a, 7b are positioned between each of the shields 1a, 1b and the corresponding surfaces of the PC board 2. Were the screws 4 not spaced sufficiently close to each other, deformation of the shields (as indicated by the dashed deformation profiles in FIG. 1A) would result, thereby producing nonuniform mechanical pressure on the compressible conductive gaskets 7a, 7b. The mechanical pressure on the gaskets 7a, 7b would be higher in the vicinity of the screws 4 than at other points along the interfaces 5a, 5b. While the closely spaced screws 4 provide some degree of uniformity in the mechanical pressure imposed on the gaskets 7a, 7b by limiting deformation or bowing of the shields 1a, 1b, to further reduce deformation and further increase the uniformity of the mechanical pressure, the shields 1a, 1b are constructed to be rigid.

To achieve rigidity, the walls 8 of the shield as shown in FIG. 1B are made thick. However, thicker walls 8 result in correspondingly larger contact area on the circuit board 2. The contact area consumes valuable circuit board area, that would otherwise be useable for mounting electrical components. When interior walls 9 are included in the shield 1a for isolating electrical components and traces within different sections of the circuit board 2, the contact area could consume a significant portion of the over-all area of the circuit board 2.

The prior art shielding scheme provides sufficient signal isolation, but the required wall thickness consumes valuable circuit board area and requires a large number of attachment screws 4 to fasten the shields to the circuit board 2.

Figure 2A:
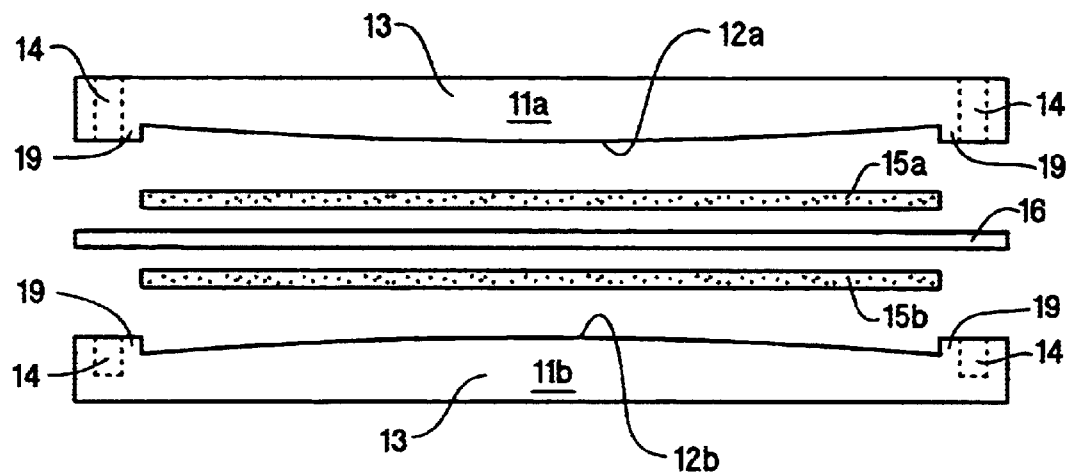
FIGS. 2A and 2B show a shielding scheme constructed according to the preferred embodiment of the present invention.
Figure 2B:
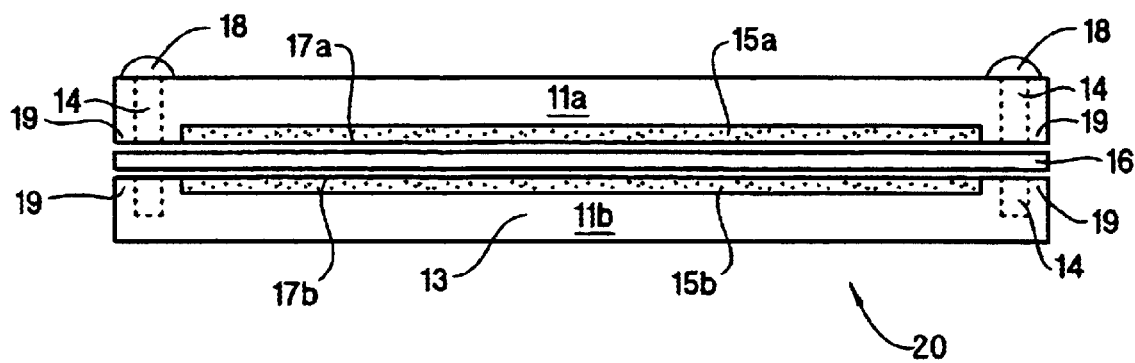

FIGS. 2A and 2B show predistorted conductive shields 11a, 11b for use in a shielding scheme constructed according to the preferred embodiment of the present invention. Predistortion, or contouring, of the mating surfaces 12a, 12b of the conductive shields 11a, 11b is exaggerated in the side view shown in FIG. 2A. In a neutral position shown in FIG. 2A, the conductive shields 11a, 11b are not fastened to a circuit board 16 and the mating surfaces 12a, 12b are predistorted to have a convex profile 13. This profile 13 is designated so that the mating surfaces 12a, 12b become flat, or coplanar, in a loaded position that results when the conductive shields 11a, 11b are fastened to the circuit board 16 at fastening points 14 to form a shielded circuit board assembly 20 as shown in FIG. 2B. The profile 13, in this example, accommodates compressible conductive gaskets 15a, 15b positioned between each of the shields 11a, 11b and the corresponding surfaces of the circuit board 16 to lower electrical resistance at the circuit board-shield interfaces 17a, 17b.

A threaded hole is provided at each fastening point 14 to receive an attachment screw 18. A series of attachment screws 18 are used to fasten the shields 11a, 11b together while sandwiching the circuit board 16 between the shields 11a, 11b. Alternatively, a series of clamps, rivets or other fasteners are used at the fastening points 14 to apply pressure on the shields 11a, 11b, so that the circuit board 16 is sandwiched between conductive shields 11a, 11b. When the shielding scheme includes compressible conductive gaskets 15a, 15b interposed between the predistorted conductive shields 11a, 11b and each of the contact surfaces of the circuit board 16, the fastening points 14 include stops 19, or stand-offs that contact the surface of the circuit board 16 and accommodate for the thickness of the gaskets 15a, 15b, preventing the gasket from being overly compressed when the shields 11a, 11b are fastened to the circuit board 16. The compressible conductive gaskets 15a, 15b in this example is a Cho-Form material, available from Chomerics, Division of Parker Hannifin Corp. that is dispensed onto the contoured mating surfaces 12a, 12b of the shield. Alternatively, the gaskets are tubular conductive elastomers or conductive paste that is screened or otherwise deposited onto the contoured mating surfaces. When Cho-Form material is used for the compressible conductive gaskets 15a, 15b, the stops 19 are formed by pedestals that are raised from the mating surfaces by a height of approximately one-half of the uncompressed thickness of the gaskets.

Figure 3:
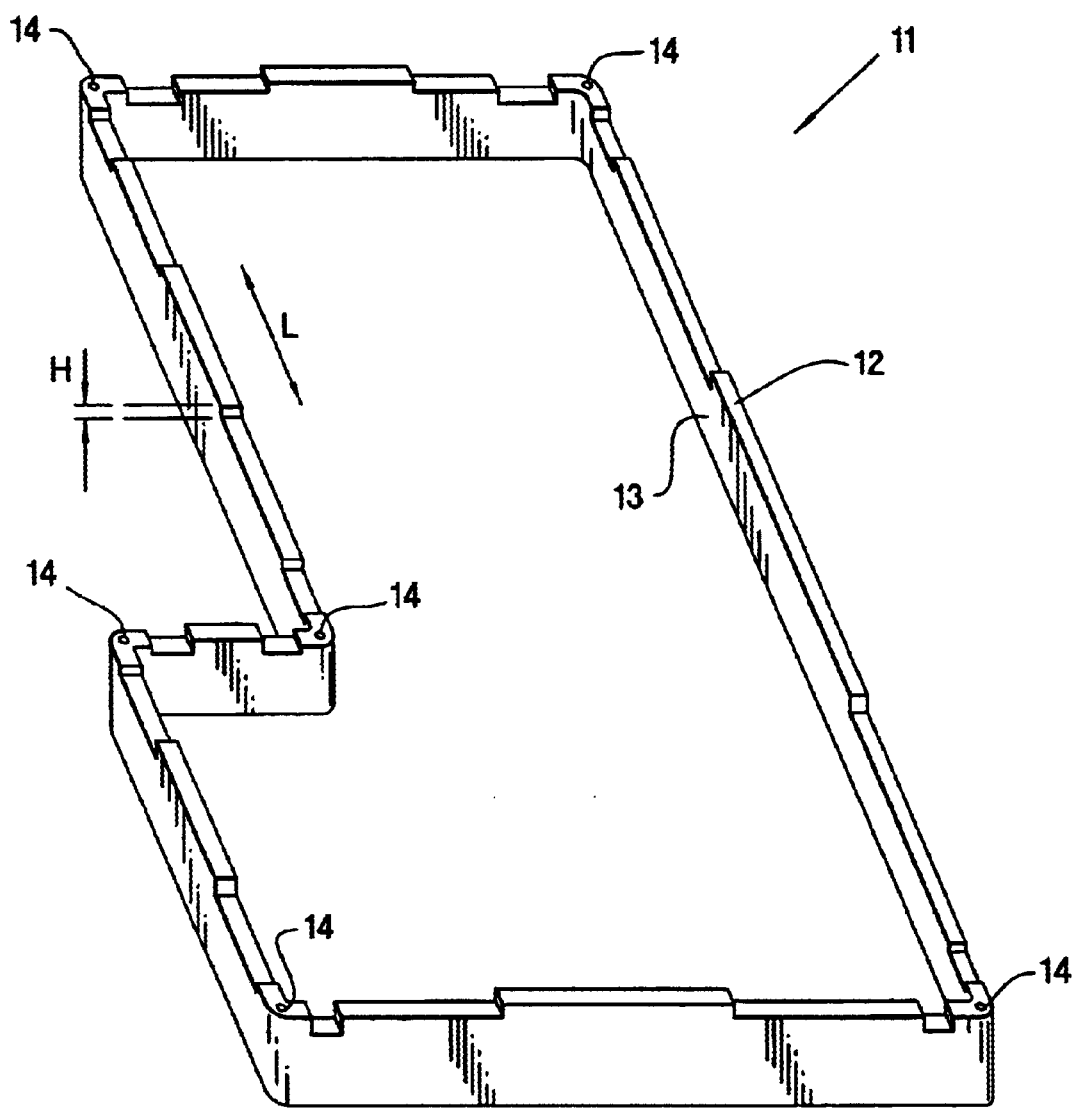
FIG. 3 shows a detailed view of a predistorted conductive shield for use in the shielding scheme shown in FIGS. 2A and 2B.

FIG. 3 shows a detailed view of a predistorted conductive shield 11 for use in the shielding scheme of FIGS. 2A and 2B. The predistorted conductive shield 11 is formed using milling, casting or other fabrication processes to produce contoured mating surfaces 12. The profile 13 of each contoured mating surface 12 is determined empirically, by computer modeling or by other techniques. Empirical determination involves constructing pilot shields (not shown) that are similar to the predistorted conductive shields 11 in all respects, with the exception that the pilot shields have mating surfaces 12 that are flat, as opposed to contoured, when in the unattached, neutral position. The pilot shields are then put in the loaded position by fastening them to the circuit board 16 using the same type of fasteners as chosen for the shielding scheme in the shielded circuit board assembly 20. The fastening deforms the pilot shields, bowing each pilot shield away from the contact surface of the circuit board, similar to the dashed deformation profiles shown in FIG. 1A. The pilot shields contact the circuit board at the fastening points, but the deformation of the pilot shields produces a gap of variable thickness between each pilot shield and the corresponding surface of the circuit board at points along the interface that are between the fastening points. These gaps are equivalently filled by the contoured mating surfaces 12 of predistorted conductive shield 11 shown in FIG. 3. The thickness of the each gap at various points along the pilot shield-board interfaces is measured optically, or mechanically. These measured gap thicknesses determine how much higher the walls of the pilot shield must be at each corresponding location on the mating surfaces, relative to the flat mating surfaces of the neutrally positioned pilot shields, to displace or fill each of the gaps. The added heights define the contour of the profile 13 of the predistorted conductive shield 11, completing the empirical determination.

The contours of the mating surfaces 12 of the predistorted conductive shields 11 are alternatively determined using computer modeling. In this determination, finite element analysis (FEA) software computes the profile 13 of the contoured mating surfaces 12. Physical dimensions of a pilot shield is entered into a three-dimensional (3D) modeling program, such as the HP Solid Designer, available from Hewlett-Packard Company. The pilot shields entered into the 3D modeling program are similarly dimensioned to the predistorted conductive shields 11 in all respects, with the exception that the pilot shields have mating surfaces that are flat, as opposed to contoured, when in the unattached, neutral position. Mechanical forces on the pilot shield are then simulated by the FEA software. The simulated forces are applied along the mating surfaces and are equal in magnitude, but opposite in direction, to the forces on the mating surfaces of pilot shields were the pilot shields in the loaded position, fastened to a circuit board at the fastening points. The magnitude of the forces is determined by the force on the mating surfaces exerted by the compressible conductive gaskets. For example, Cho-Form material, exerts forces of approximately 6 pounds per square inch when the gasket material is compressed by approximately 50%. While this force is in the direction that points away from the circuit board when the shields are in the loaded position, that is fastened to the circuit board, the force entered into the FEA software is in a direction that points toward the circuit board. Based on the entered forces, the FEA software indicates the profile 13 of the contoured mating surfaces 12 for the predistorted conductive shields 11.

Once the contours of the profiles 13 are defined using computer modeling, empirical determination or other techniques, the profiles 13 are established in the wall heights to form the contoured mating surfaces 12 of the predistorted conductive shields 11. The profiles 13 are implemented in a manner consistent with the manufacturing technique. For example, when the predistorted conductive shields are milled, the contours of the profiles 13 are approximated in a segmented fashion (as shown in FIG. 3) that includes discrete steps in the height of the walls. The length L and height H of each step is chosen to best fit to the profile 13. When the predistorted conductive shields 11 are cast, the profiles 13 are more readily formed by continuously varying the wall heights of the predistorted conductive shields 11 (as shown in FIG. 2A).

While the preferred embodiment of the present invention has been illustrated in detail, it should be apparent that modifications and adaptations to this embodiment may occur to one skilled in the art without departing from the scope of the present invention as set forth in the following claims.

What is claimed is:

1. A shielding scheme for a circuit board, comprising:
   a first conductive shield having a first series of fastening points and a first series of predistorted surfaces for mating with a contact area on a first side of the circuit board; and a second conductive shield having a second series of fastening points aligned with the first series of fastening points, and having a second series of predistorted surfaces for mating with a contact area on a second side of the circuit board, wherein the first series of predistorted surfaces is adapted become coplanar with the first side of the circuit board and the second series of predistorted surfaces is adapted become coplanar with the second side of the circuit board under condition that the first conductive shield is fastened to the second conductive shield at the fastening points.

2. The shielding scheme of claim 1 further comprising a first compressible conductive gasket interposed between the first conductive shield and the contact area on the first side of the circuit board and a second compressible conductive gasket interposed between the second conductive shield and the contact area on the second side of the circuit board under condition that the first conductive shield is fastened to the second conductive shield at the fastening points.

3. The shielding scheme of claim 2 wherein each fastening point of the first conductive shield includes a stop having a raised pedestal accommodating the thickness of the first compressible conductive gasket and each fastening point of the second conductive shield includes a stop having a raised pedestal accommodating the thickness of the second compressible conductive gasket, the stops of the fastening points of the first conductive shield contacting the first side of the circuit board and the stops of the fastening points of the second conductive shield contacting the second side of the circuit board under condition that the first conductive shield is fastened to the second conductive shield at the fastening points.

4. The shielding scheme of claim 3 wherein the first compressible conductive gasket and the second compressible conductive gasket are tubular.

5. The shielding scheme of claim 3 wherein the first compressible conductive gasket and the second compressible conductive gasket are formed from conductive paste.

6. The shielding scheme of claim 1 wherein the first predistorted surface has a first convex profile and the second predistorted surface has a second convex profile.

7. The shielding scheme of claim 6 wherein the first series of predistorted surfaces and the second series of predistorted surfaces each include a plurality of raised segments having discrete heights.

8. The shielding scheme of claim 6 wherein the first series of predistorted surfaces and the second series of predistorted surfaces each have continuously varying heights.

9. The shielding scheme of claim 1 wherein one of the first series of fastening points and the second series of fastening points includes threaded holes for receiving a corresponding series of screws.

10. A shielded circuit board assembly, comprising:
  a circuit board;
  a first conductive shield having a first series of fastening points and a first series of predistorted surfaces for mating with a contact area on a first side of the circuit board, each fastening point in the first series having a corresponding step;
  a first compressible conductive gasket interposed between the first side of the circuit board and the first conductive shield;
  a second conductive shield having a second series of fastening points aligned with the first series of fastening points, and having a second predistorted contact surface for mating with a contact area on a second side of the circuit board, each fastening point in the second series having a corresponding step;
  a second compressible conductive gasket interposed between the second side of the circuit board and the second conductive shield, wherein the first series of predistorted surfaces lie within a first plane and the second series of predistorted surfaces lie within a second plane by fastening the first conductive shield to the second conductive shield at the fastening points and the stops of the first series fastening points contact the first side of the circuit board and the stops of the second series of fastening points contact the second side of the circuit board.

11. The shielded circuit board assembly of claim 10 wherein the first compressible conductive gasket and the second compressible conductive gasket are tubular.

12. The shielded circuit board assembly of claim 10 wherein the first compressible conductive gasket and the second compressible conductive gasket are formed from conductive paste.

13. The shielded circuit board assembly of claim 10 wherein, prior to fastening the first conductive shield to the second conductive shield, the first predistorted surface has a first convex profile and the second predistorted surface has a second convex profile.

14. The shielded circuit board assembly of claim 13 wherein the first predistorted surface and the second predistorted surface each include a plurality of raised segments having discrete heights.

15. The shielded circuit board assembly of claim 13 wherein the first series of predistorted surface and the second predistorted surface each have continuously varying heights.

16. A shielded circuit board assembly, comprising:
  a circuit board;
  a first conductive shield having a first series of fastening points and a first series of predistorted surfaces for mating with a contact area on a first side of the circuit board, each fastening point in the first series of fastening points having a corresponding stop;
  a first compressible conductive gasket deposited on the first series of predistorted surfaces for interposing between the first side of the circuit board and the first conductive shield;
  a second conductive shield having a second series of fastening points aligned with the first series of fastening points, and having a second series of predistorted surfaces for mating with a contact area on a second side of the circuit board, each fastening point in the second series of fastening points having a corresponding stop;
  a second compressible conductive gasket deposited on the second series of predistorted surfaces for interposing between the second side of the circuit board and the second conductive shield, wherein the first conductive shield is fastened to the second conductive shield at the fastening points to cause the first series of predistorted surfaces to lie within a first plane when the corresponding stops of the first series of fastening points contact the first side of the circuit board and the second series of predistorted surfaces to lie within a second plane when the corresponding stops of the second series of fastening points contact the second side of the circuit board.

17. The shielded circuit board assembly of claim 16 wherein, prior to fastening the first conductive shield to the second conductive shield, the first series of predistorted surfaces has a first convex profile and the second series of predistorted surface has a second convex profile.

18. The shielded circuit board assembly of claim 17 wherein the first series of predistorted surfaces and the second series of predistorted surfaces each include a plurality of raised segments having discrete heights.

19. The shielded circuit board assembly of claim 17 wherein the first series of predistorted surfaces and the second series of predistorted surfaces each have continuously varying heights.

20. The shielded circuit board assembly of claim 16 wherein the first compressible conductive gasket and the second compressible conductive gaskets are formed from conductive paste.

\* \* \* \* \*